United States Patent
Taylor (10) Patent No.: US 12,469,994 B2
(45) Date of Patent: Nov. 11, 2025

(54) HIGH PERFORMANCE INTERPOSER

(71) Applicant: Amphenol Corporation, Wallingford, CT (US)

(72) Inventor: Paul R. Taylor, Mechanicsburg, PA (US)

(73) Assignee: Amphenol Corporation, Wallingford, CT (US)

( * ) Notice: Subject to any disclaimer, the term of this patent is extended or adjusted under 35 U.S.C. 154(b) by 491 days.

(21) Appl. No.: 17/972,388

(22) Filed: Oct. 24, 2022

(65) Prior Publication Data

US 2023/0140379 A1     May 4, 2023

Related U.S. Application Data

(60) Provisional application No. 63/272,737, filed on Oct. 28, 2021.

(51) Int. Cl.
*H01R 12/57* (2011.01)
*H01R 12/70* (2011.01)
(Continued)

(52) U.S. Cl.
CPC ......... *H01R 12/57* (2013.01); *H01R 12/7082* (2013.01); *H01R 12/714* (2013.01); *H01R 13/2435* (2013.01); *H01R 13/2442* (2013.01)

(58) Field of Classification Search
CPC ............... H01R 12/57; H01R 12/7082; H01R 12/714; H01R 13/2435; H01R 13/2442;
(Continued)

(56) References Cited

U.S. PATENT DOCUMENTS 4,688,864 A * 8/1987 Sorel ............... H05K 7/023
439/74
5,729,433 A * 3/1998 Mok ............... H01L 23/5385
361/704
(Continued)

FOREIGN PATENT DOCUMENTS

CN    103545659 A    1/2014
EP      1801924 A2   6/2007
(Continued)

OTHER PUBLICATIONS

[No Author Listed], M-Series—10152299-191ULF. Amphenol Communications Solutions 2023. 2 pages. URL:https://www.amphenol-cs.com/m-series-10152299191ulf.html. [Last accessed Jan. 9, 2023].
(Continued)

*Primary Examiner* — Briggitte R. Hammond
(74) *Attorney, Agent, or Firm* — Wolf, Greenfield & Sacks, P.C.

(57) ABSTRACT

An interposer configured for connecting arrays of signal pads on parallel surfaces is described. Contacts of the interposer are configured to provide multiple conductive paths. A first conductive path extends through the body of the contact. A second conductive path is formed in parallel to the first conductive path when the contact is compressed between opposed substrates. The contact includes an intermediate portion, a rigid portion laterally extending from the intermediate portion, and a pair of compliant arms extending from the intermediate portion in opposite directions along the mating axis. When the contact is compressed, both arms touch and form an electrical connection with the rigid portion. The presence of the rigid portion allows for a reduction in the length of the beams in tall contacts.

28 Claims, 7 Drawing Sheets

(51) Int. Cl.
*H01R 12/71* (2011.01)
*H01R 13/24* (2006.01)

(58) Field of Classification Search
CPC .... H01R 12/73; H01R 13/2492; H01R 12/7052;
H01R 12/7064; H01R 12/7076; H01R
12/716; H01R 13/14; H01R 13/2414;
H01R 13/42
See application file for complete search history.

(56) References Cited

U.S. PATENT DOCUMENTS

| | | |
|---|---|---|
| 6,354,844 B1 * | 3/2002 | Coico ................. H05K 3/325 |
| | | 439/74 |
| 6,533,613 B1 | 3/2003 | Turner et al. |
| 6,905,343 B1 | 6/2005 | Neidich |
| 9,425,525 B2 | 8/2016 | Walden et al. |
| 9,543,703 B2 | 1/2017 | Horchler et al. |
| 10,116,080 B1 | 10/2018 | Ju et al. |
| 10,135,199 B1 | 11/2018 | Ju |
| 10,148,024 B2 | 12/2018 | Ju et al. |

FOREIGN PATENT DOCUMENTS

| | | |
|---|---|---|
| EP | 2873121 A1 | 5/2015 |
| JP | 6224706 B2 | 11/2017 |
| JP | 6615845 B2 | 12/2019 |

OTHER PUBLICATIONS

Taylor et al., High Performance Interposer And Chip Socket, U.S. Appl. No. 17/983,107, filed Nov. 8, 2022.

* cited by examiner

HIGH PERFORMANCE INTERPOSER

RELATED APPLICATIONS

This application claims the benefit of U.S. Provisional Application Ser. No. 63/272,737, filed on Oct. 28, 2021, and entitled "TALL HEIGHT INTERPOSER WITH FORMED SHUNTING EXTENSION," which is hereby incorporated herein by reference in its entirety.

BACKGROUND

This patent application relates generally to interconnection systems and more particularly to systems with interposers that provide multiple electrical connections between components, including sockets providing multiple connections between a semiconductor chip and a printed circuit board.

Electronic systems are frequently assembled by integrating components that each performs specific functions, such as processors, memories, transceivers or other communications interfaces. Such an approach enables different component manufacturers to specialize in the design and manufacture of their components, leading to better performing components. Further, using the same components in multiple electronic systems enables mass production of each component, which provides economies of scale.

Interconnections between components in an electronic system are often provided by a printed circuit board (PCB), which contains multiple layers of conductive structures, including signal traces that can pass electrical signals from one location on the printed circuit board to another. Connections may be made to the conductive structures inside the PCB using holes, drilled fully or partially through the board and then plated with metal. These plated holes, sometimes called vias, are electrically connected to conductive structures within the board through which the holes pass. Connection points on the components, sometimes called leads, might also be connected to the vias, completing a connection between the component and the traces or other conductive structures in the PCB. Connection between leads of the component and the vias might be made, for example, by inserting the lead into the via or by forming a pad on the surface of the PCB on top of the via and connecting the lead to the pad.

Connections between the lead on the component and the via may be made in various ways, such as by using solder or by shaping the contact to generate a spring force on the via or a pad attached to the via. In some systems, a component may be attached to a PCB through a socket. The socket has contacts that are connected at a mounting portion to the vias on the PCB and mating portions at the other end that are connected to leads on a component. In some instances, the lead on the component may be a pad on a surface of the component and the mating portions of the contacts of the socket may be compliant so that they exert a force against the pads when the component is pressed into the socket. The socket may include latching structures to hold the component in the socket and press it against the mating portions of the contacts.

A socket may include an interposer, which is a component that can make multiple connections between a printed circuit board and a component pressed against the interposer. Interposers may be made with molded plastic housings and metal contacts inserted in channels in the housing. Interposers may be attached to the printed circuit board in any of multiple ways. For example, solder balls may be attached to the mounting portions of the contacts and the interposer may be attached to the PCB in a reflow solder operation. In other interposers, the mounting portions of the contacts may be spring fingers designed to press against pads on a surface of the PCB. Screws or other hold down structures may ensure that the interposer is pressed against the PCB so that the spring fingers are compressed and generate a desired contact force.

The contacts in the interposer are frequently positioned in an array with mounting portions aligned with pads on the PCB and mating ends aligned with pads on the component being connected to the PCB. Each contact may carry a signal or be connected to ground. The pattern of the contacts in the array, and their function as signal or ground conductors, may be selected to provide good integrity of signals passing through the interposer. Signal carrying contacts, for example, may be positioned between ground contacts. Also, the signal carrying contacts may be positioned in pairs that carry differential signals. However, constraints, such as the position or function of the pads on the PCB or on the component pressed into the interposer may preclude an arbitrary positioning of signal and ground contacts.

SUMMARY

Some embodiments relate to A contact for an interposer, the contact comprising an intermediate portion; a first compliant arm extending from the intermediate portion in a first direction, the first compliant arm comprising a first contact region; and a projection extending from the intermediate portion in a second direction perpendicular to the first direction, the projection comprising a first bent portion forming a first strip that is angled relative to the first direction and facing the first contact region.

In some embodiments, the projection further comprises a second bent portion forming a second strip parallel to the first strip; and the contact further comprises a second compliant arm extending from the intermediate portion in a direction opposite the first direction, the second compliant arm comprising a second contact region facing the second strip.

In some embodiments, the first bent portion extends from the projection in a third direction perpendicular to both the first and second directions.

In some embodiments, the first arm is more compliant in the first direction than it is in the third direction.

In some embodiments, the contact further comprises a tab extending from the intermediate portion in the third direction, wherein the tab is parallel to the first strip.

In some embodiments, the intermediate portion lies substantially in a third plane perpendicular to the second direction.

In some embodiments, the first compliant arm comprises a first curved region positioned, along a length of the first compliant arm, between the intermediate portion and the first contact region, wherein the first curved region has a first convex region facing in the first direction and a first concave region facing away from the first direction.

In some embodiments, the first compliant arm further comprises a pair of wings positioned adjacent to the first curved region.

In some embodiments, the first contact region comprises a second curved region having a second concave region and a second convex region, wherein the second convex region faces the first strip and the second concave region faces away from the first strip.

In some embodiments, the projection is made from a portion of a metal sheet, wherein, when the portion of the metal sheet is planar, the projection has a T-shape or a π-shape.

In some embodiments, the contact has a height along the first direction in a fully compressed state in excess of 1.8 mm.

In some embodiments, the contact has a width along the second direction in the fully compressed state in excess of 1 mm.

In some embodiments, the first strip substantially lies in a plane perpendicular to the first direction.

Some embodiments relate to an interposer comprising an insulative member comprising a plurality of channels extending in a first direction from a first surface of the insulative member to a second surface of the insulative member opposite the first surface; and a plurality of contacts held in the plurality of channels, each of the plurality of contacts comprising: an intermediate portion; a first compliant arm extending from the intermediate portion in the first direction, the first compliant arm comprising a first contact region exposed at the first surface of the insulative member and a second contact region, wherein the first contact region is positioned, along a length of the first compliant arm, between the intermediate portion and the second contact region; and a projection extending from the intermediate portion in a second direction perpendicular to the first direction, the projection comprising a first strip configured to touch the second contact region of the first compliant arm.

In some embodiments, the interposer further comprises a second compliant arm extending from the intermediate portion in a direction opposite the first direction, the second compliant arm comprising a third contact region exposed at the second surface of the insulative member and a fourth contact region, wherein the third contact region is positioned, along a length of the second compliant arm, between the intermediate portion and the fourth contact region. The projection further comprises a second strip configured to touch the fourth contact region of the second compliant arm.

In some embodiments, the first compliant arm and the first strip are configured such that the second contact region of the first compliant arm wipes against the first strip when the first compliant arm is compressed.

In some embodiments, the second compliant arm and the second strip are configured such that the fourth contact region of the second compliant arm wipes against the second strip when the second compliant arm is compressed.

In some embodiments, the intermediate portion lies substantially in a first plane; the projection lies substantially in a second plane; the first strip lies substantially in a third plane; and the first, second and third planes are mutually perpendicular to each other.

In some embodiments, each of the plurality of contacts further comprises a tab extending from the intermediate portion and engaging with a wall of the respective channel.

In some embodiments, the plurality of contacts are slidably retained in the respective channels in the first direction.

In some embodiments, the plurality of contacts have heights along the first direction in excess of 1.8 mm.

Some embodiments relate to a method for connecting a first electronic component with a second electronic component through an interposer comprising a plurality of contacts, each contact comprising an intermediate portion, a projection, a first complaint arm and a second compliant arm, the method comprising: forming a first conductive path from the first electronic component to the second electronic component such that the first conductive path extends through the intermediate portion, wherein forming the first conductive path comprises placing the first compliant arm in contact with the first electronic component and the second compliant arm in contact with the second electronic component; and moving the first electronic component and the second electronic component together to form a second conductive path, at least partially in parallel with the first conductive path, from the first electronic component to the second electronic component such that the second conductive path extends through the projection, wherein forming the second conductive path comprises: deflecting the first compliant arm into contact with the projection; and deflecting the second compliant arm into contact with the projection.

In some embodiments, the first conductive path has a current density that extends through the intermediate portion to a greater extent than it extends through the projection.

In some embodiments, the second conductive path has a current density that extends through the projection to a greater extent than it extends through the intermediate portion.

In some embodiments, deflecting the first compliant arm into contact with the projection comprises pressing the first compliant arm against a first strip of the projection, and wherein: the intermediate portion lies substantially in a first plane; the projection lies substantially in a second plane; the first strip lies substantially in a third plane; and the first, second and third planes are mutually perpendicular to each other.

In some embodiments, the method further comprises further deflecting the first compliant arm to wipe against the first strip.

In some embodiments, further deflecting the first compliant arm causes a distal end of the first compliant arm to move closer to the intermediate portion.

Some embodiments relate to an electronic device, comprising a first printed circuit board (PCB) comprising a first plurality of pads; a second PCB parallel to the first PCB and separated from the first PCB along a first direction by a distance between 1.9 mm and 10 mm, the second PCB comprising a second plurality of pads; an electronic component mounted on the first PCB, wherein the second PCB at least partially covers the electronic component; and an interposer disposed between the first PCB and the second PCB, the interposer having a plurality of contacts placing the first plurality of pads in electrical communication with respective pads of the second plurality of pads.

In some embodiments, each contact of the plurality of contacts comprises: an intermediate portion; a first compliant arm in contact with a respective pad of the first plurality of pads and extending from the intermediate portion in the first direction, the first compliant arm comprising a first contact region; and a projection extending from the intermediate portion in a second direction perpendicular to the first direction, the projection comprising a first bent portion forming a first strip that is angled relative to the first direction and facing the first contact region.

In some embodiments, the projection further comprises a second bent portion forming a second strip parallel to the first strip; and each contact further comprises a second compliant arm in contact with a respective pad of the second plurality of pads and extending from the intermediate portion in a direction opposite the first direction, the second compliant arm comprising a second contact region facing the second strip.

In some embodiments, the first bent portion extends from the projection in a third direction perpendicular to both the first and second directions.

The foregoing features may be used separately or in any suitable combination. The foregoing is a non-limiting summary of the invention, which is defined by the attached claims.

BRIEF DESCRIPTION OF DRAWINGS

The accompanying drawings are not intended to be drawn to scale. In the drawings, each identical or nearly identical component that is illustrated in various figures is represented by a like numeral. For purposes of clarity, not every component may be labeled in every drawing. In the drawings.

DESCRIPTION OF PREFERRED EMBODIMENTS

The inventors have recognized and appreciated techniques for making an interposer to support electrical connections through the interposer with high signal integrity while simultaneously meeting the mechanical requirements for a high density electronic device. Those interposers may enable high integrity connections between arrays of contact points on a first substrate (e.g., a printed circuit board) and arrays of contact points on a second substrate (e.g., another printed circuit board or a semiconductor chip). These high integrity connections may be supported even for a relatively large separation between the first and second substrate and a relatively high density of connections.

Interposers as described herein may support an electronic device with a mezzanine or stacking configuration, such that the electrical interface of the first substrate is in a plane parallel to the plane of the electrical interface of the second substrate. For example, the first substrate may include pads formed on a top surface of the first substrate and the second substrate may include pads formed on a bottom surface of the second substrate, where the top surface of the first substrate is parallel to the bottom surface of the second substrate. During operation, the pads on the first substrate are electrically connected to the pads of the second substrate through the interposer. With interposers as describe herein, the first and second substrates may be separated by a sufficient distance to enable components mounted on either first or second substrate to occupy the space between the substrates. While such a configuration enables a high density of electronic components, constructing an interposer that spans that separation and meets the electrical and mechanical requirements of a high speed, high density electronic system poses challenges.

Interposers as described herein may include arrays of contacts designed to electrically connect points of contact on a first substrate to points of contact on a second substrate. The contacts may provide vertical compliance in one direction (e.g., towards the upper substrate or towards the lower substrate, but not both) or in two opposed directions (e.g., towards the upper substrate and simultaneously towards the lower substrate). The vertical compliance increases the interposer tolerance with respect to variations in the vertical extension of the various components that constitute the electronic assembly, including variations in the heights of the substrates and the interposer.

Further, each contact may provide two (or more) conductive paths between the points of contact. For example, a first conductive path may be established by simply causing a contact to touch two opposed pads, and a second conductive path may be established as a result of the compression of the contact as it is pressed against those pads. Multiple conductive paths lead to a reduction in the contact inductance and resistance and avoids electrical stubs, thereby improving signal integrity. Accordingly, some embodiments are directed to an interposer having contacts configured so that each contact, when compressed by a pair of opposed substrates, provides a first conductive path and a second conductive path parallel to the first conductive path.

The inventors have recognized and appreciated designs for interposer contacts to provide two (or more) conductive paths between parallel substrates separated by a relatively large distance. For example, parallel substrates may be separated from one another by a distance greater than 1.8 mm, such as between 1.9 mm and 10 mm or between 1.9 mm and 3 mm. As the distance between substrates increases, the thickness of interposers, and consequently, the height of the contacts must also be increased. Accordingly, contact heights in excess of 1.8 mm are required in some arrangements (the height being measured in the fully compressed state).

Such designs may be achieved without increasing the lateral extension (the width) of the contacts because doing so would otherwise reduce the density of contacts per unit volume within the interposer. For example, some interposers have a contact pitch of 1 mm or less. To support connections between similar components with a larger separation, an interposer may be provided with contacts with high aspect ratios (with relatively tall and thin geometries), as described herein.

Unfortunately, designing contacts with high aspect ratios and, simultaneously, to provide multiple parallel conductive paths is challenging from a mechanical standpoint. One approach is to design contacts with arms at each end that make electrical contact with each other. When such a contact is compressed between two substrates, both compliant arms bend inwardly. At some point along the bending range (e.g., halfway through the bending range), the arms directly touch one another, thereby forming an additional conductive path in parallel to the first conductive path. While this design works well for relatively short contacts, it does not provide reliable connections where the contacts are tall. Tall contacts require that the arms be sufficiently long to cover the additional contact height when they bend. However, increasing the length of an arm—without simultaneously increasing its lateral extent (because, as explained above, doing so would reduce the contact density)—leads to unreliable connections as the arms may be too compliant to form a reliable electrical connection or even to ensure that the arms will press against each other.

The inventors have recognized and appreciated that reliable operation of a high aspect ratio contacts may be provided by contacts with a rigid portion which both arms can touch when compressed. This design enables contacts with arbitrarily high aspect ratios. In this design, an additional conductive path is formed by causing the arms to touch the rigid portion. Contacts that include these rigid portions can be designed with shorter arms than would be necessary in the absence of a rigid portion. In one example, a contact includes an intermediate portion, a pair of compliant arms extending from the intermediate portion in opposite directions parallel to the mating direction, and a rigid portion protruding laterally from the intermediate portion. The rigid portion includes a pair of landing strips positioned at opposite ends of the rigid portion, where the landing strip are configured to contact a respective compliant arm as the compliant arm is compressed. Such a contact may be made by stamping a sheet of metal to form a unitary planar piece, and by bending this piece at multiple locations to provide the desired shape.

Figure 1:
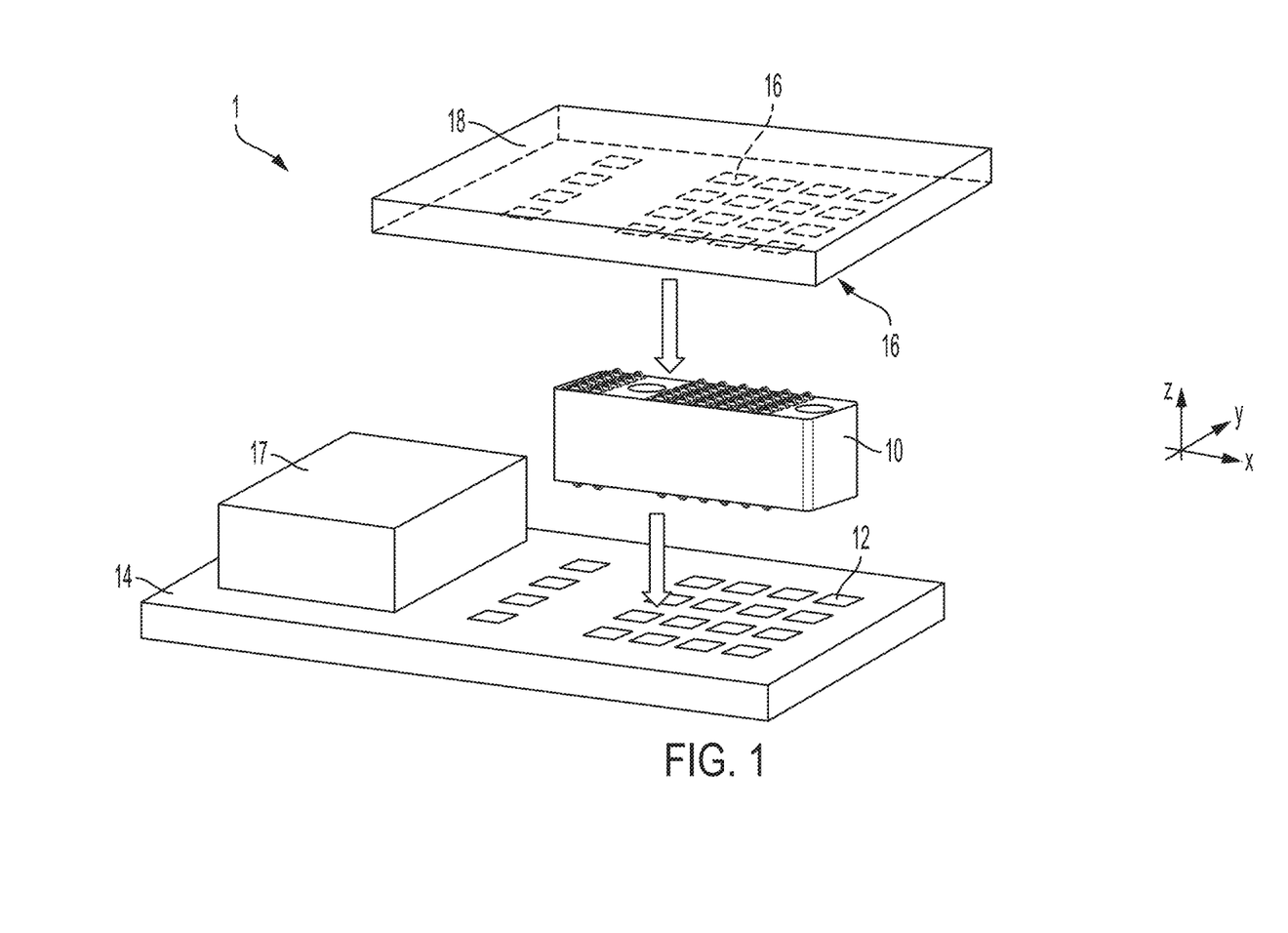
FIG. 1 is an exploded perspective view of an electronic assembly including an interposer, in accordance with some embodiments.

FIG. 1 is a perspective view of an electronic assembly including an interposer, in accordance with some embodiments. Electronic assembly 1 includes substrates 14 and 18, an interposer 10 and another electronic component 17. In some embodiments, substrates 14 and 18 may be part of respective electronic components. For example, substrate 14 may be a PCB (e.g., a motherboard) and substrate 18 may be a semiconductor card (e.g., a processor card), for example. In such arrangements, interposer 10 may be a portion of a chip socket including mounting hardware attached to substrate 14 (not shown for simplicity of illustration). Alternatively, substrate 18 may also be a PCB or a connector carrying cables connected to a device positioned outside assembly 1.

In electronic assembly 1, the electrical interface of substrate 14 is in a plane parallel to the plane of the electrical interface of substrate 18. In the example of FIG. 1, substrate 18 includes pads 16 formed on the bottom surface of substrate 18, and substrate 14 includes pads 12 formed on the top surface of substrate 14, where the bottom surface of substrate 18 is parallel to the top surface of substrate 14. During operation, pads 16 are in electrical contact with pads 12 via interposer 10.

The separation between the substrates, and consequently, the thickness of interposer 10 (along the z-axis) may be sufficiently large to allow electronic component 17 to fit near interposer 10 under substrate 18. In some embodiments, electronic component 17 has a height in excess of 1.8 mm. Electronic component 17 may include, for example, a bank of memory cards or may be a connector terminating a plurality of cables carrying signals that pass through interposer 10 to components on substrate 18. In some embodiments, the lateral extension of substrate 18 is such that electronic component 17 lies at least partially under substrate 18. As a result, substrates 18 at least partially covers electronic component 17. In these embodiments, in order to ensure a reliable connection between substrates 18 and 14, interposer 10 (and, consequently, contacts 100) should be designed to be taller than electronic component 17.

Interposer 10 may be mounted to substrate 14 (using posts, bolts, latches, or other hardware not shown for simplicity), and electrical connections may be formed via spring-loaded contacts. For example, interposer 10 may include compliant beams at the bottom side of interposer 10. Latching structures (not shown in FIG. 1) may retain interposer 10 in place on substrate 14, thereby allowing the spring-loaded contacts to produce a force towards substrate 14. Further, substrate 18 may be pressed into the top surface of interposer 10. Electronic assembly 1 may include posts, bolts, latches, or other hardware (not shown in FIG. 1) to hold substrate 18 to the interposer and to press the substrate against the mating portions of the interposer contacts. In some embodiments, the upper mating portions of the contacts of the interposer 10 may be compliant and may exert a force against pads 16 when substrate 18 is pressed against the interposer. Similarly, the lower mating portions of the contacts of the interposer 10 may be compliant and may exert a force against pads 12 when substrate 14 is pressed against the interposer.

Figure 2A:
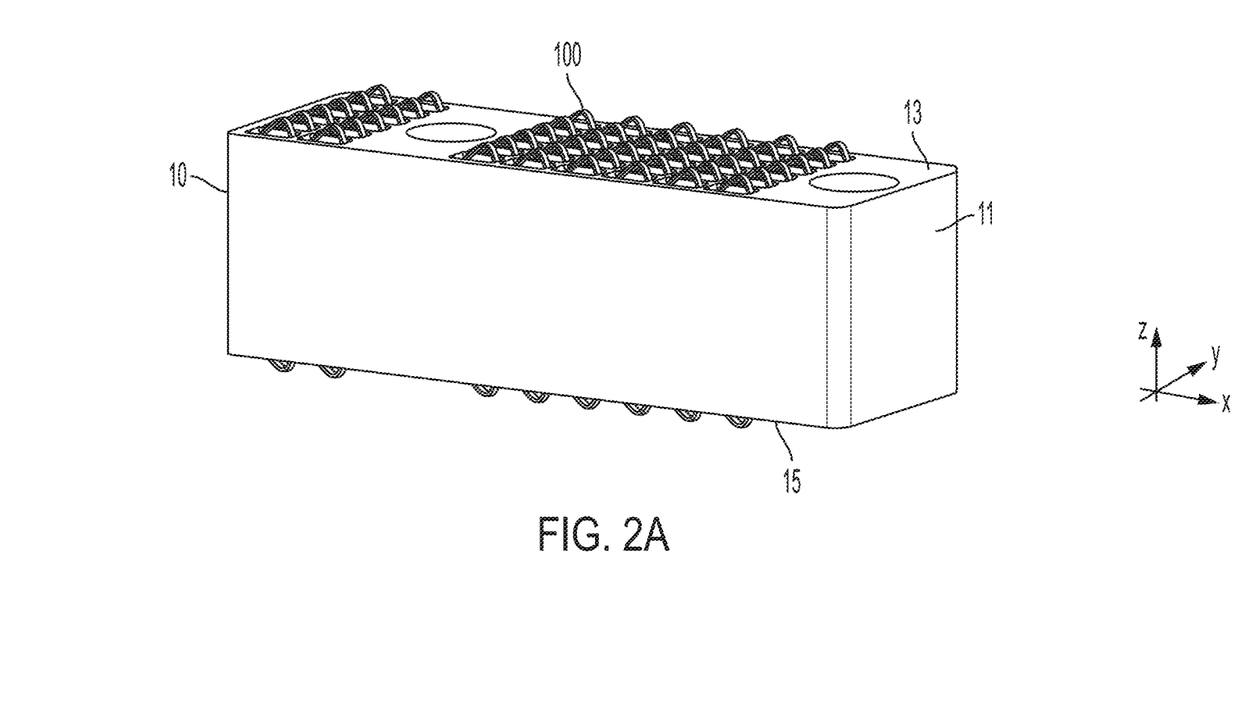
FIG. 2A is a perspective view of an interposer including an array of contacts, in accordance with some embodiments.

FIG. 2A is a perspective view illustrating an interposer 10 in additional detail, in accordance with some embodiments. Interposer 10 includes an insulative member 11 serving as the interposer housing. Insulative member 11 includes a top surface 13 and a bottom surface 15, which opposes top surface 13. Insulative member 11 holds an array of contacts 100, which may be arranged in an array, here shown as a rectangular array with rows and columns, for example. Each contact 100 includes an upper mating portion that is exposed at top surface 13 and a lower mating portion that is exposed at bottom surface 15. Being exposed outside the interposer housing, the upper mating portions allow for electrical connections with substrate 18 and, similarly, the lower mating portions allow for electrical connections with substrate 14. Insulative member 11 may include channels through which the bodies of the contacts are passed and retained.

Figure 2B:
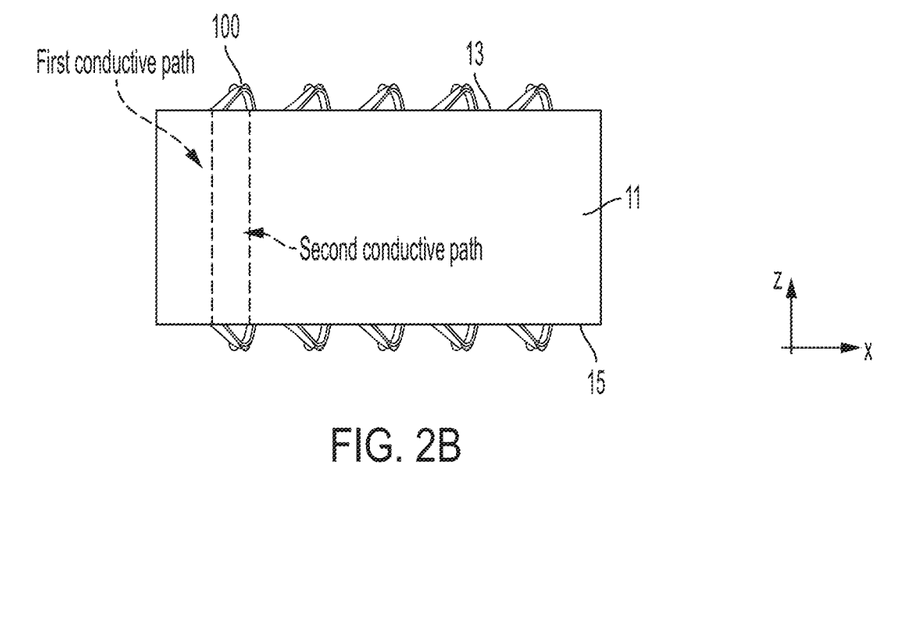
FIG. 2B is a side view of the interposer of FIG. 2A, in accordance with some embodiments.

In some embodiments, each contact of an interposer 10 may provide two (or more) parallel conductive paths electrically connecting a pad 12 with a pad 16. Providing multiple parallel conductive paths may reduce the overall contact inductance and the overall contact resistance and short out electrical stubs that would otherwise be formed by the distal portions of the contact arms, thereby improving signal integrity. FIG. 2B is a cross sectional view of an interposer 10, in accordance with some embodiments. This depiction illustrates that one of the contacts 100, which includes an upper mating portion exposed at the top surface 13 and a lower mating portion exposed at the bottom surface 15, forms two parallel paths through its length (labeled "first conductive path" and "second conductive path" respectively). Although not illustrated, the other contacts 100 may be designed in a similar fashion.

Some embodiments relate to contacts designed to provide parallel conductive paths while simultaneously ensuring reliable mechanical connections. Some such embodiments relate to contacts with tall and thin geometries. These geometries allow the contacts to satisfy contact density requirements while also providing sufficient play to accommodate electronic components of varying dimensions. As one example, a contact may have a height (along the z-axis, which is perpendicular to the substrates connected by interposer 10) that is greater than 1.8 mm (such as between 1.9 mm and 3 mm or between 1.8 mm and 10 mm) in the fully compressed state and may have a width (along the x-axis) less than 1 mm (such as between 0.2 mm and 0.8 mm) in the fully compressed state.

As explained above, designing contacts to be tall and thin, and, simultaneously, to provide multiple parallel conductive paths is challenging. In some embodiments, this may be accomplished by causing the contact's upper arm and the contact's lower arm, when compressed, to touch a rigid portion positioned between those arms. The inventors have recognized and appreciated that such an arrangement provides more reliable connections relative to arrangements in which, when compressed, the arms directly touch one another. This is because inserting a rigid portion between the arms fills part of the vertical extension of the contact, thereby enabling a reduction in the vertical extension of the arms. Having shorter arms is advantageous in that the arms may have mechanical properties that ensure reliable connections when the contact is compressed.

In some embodiments, each contact 100 may be made of a unitary piece of conductive material. Contacts 100 may be fabricated, for example, by stamping a sheet of metal to cut out a piece with a predefined shape and by folding the stamped shape to provide the desired geometry. In some embodiments, the sheet has a thickness between 0.030 mm and 0.070 mm (e.g., 0.050 mm). Different materials may be used for the metal sheet, including copper alloys. In one example, the metal sheet may be made of a copper-nickel-silicon alloy. In some embodiments, plating such as one or more of nickel, gold, silver, or tungsten, among others may be applied to all or portions of the contact. Contact portions of the contact, for example, may be plated.

Figure 3A:
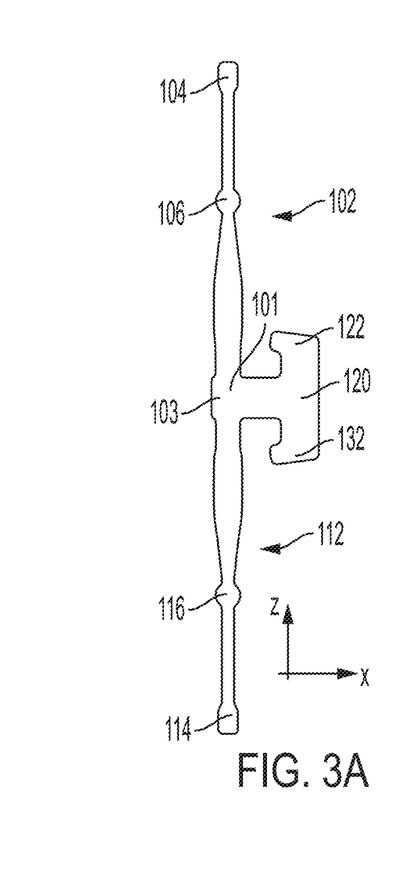
FIG. 3A is a side view of a stamped portion of a metal sheet, in accordance with some embodiments.

FIG. 3A illustrates a stamped portion of a metal sheet that may be formed into a contact, in accordance with some embodiments. At this stage (prior to being bent), the contact has a planar shape. The contact includes an intermediate portion 101, which may be positioned generally in the middle of the contact (relative to the z-axis). Arm 102 extends from intermediate portion 101 in the upwards direction (along the z-axis) and arm 112 extends from intermediate portion 101 in the downwards direction (along the z-axis). Both arms 102 and 112 are elongated along the z-axis. The width of both arms, (relative to the x-axis) varies along the length of the arms. The arm portions closer to the intermediate portion 101 are wider than the distal arm portions. As a result, the elasticity of the arms varies along their lengths. Each arm includes a pair of wings 106 laterally extending from the arms. The wings 106 provide high hertzian contact pressure when the contact force is low, such as for a 0.050 mm thick material. The distal ends of the arms include widened portions 104 and 114, respectively, which serve as the arms' contact regions. Contact 100 further includes a projection 120 extending laterally (along the x-axis) from intermediate portion 101. The projection may be sized to be substantially rigid with respect to the z-axis. In this example, projection 120 is T-shaped. Ends 122 and 132 are defined on opposite sides of projection 120 relative to the z-axis. A tab 103 extends from intermediate portion 101 opposite projection 120.

Figure 3B:
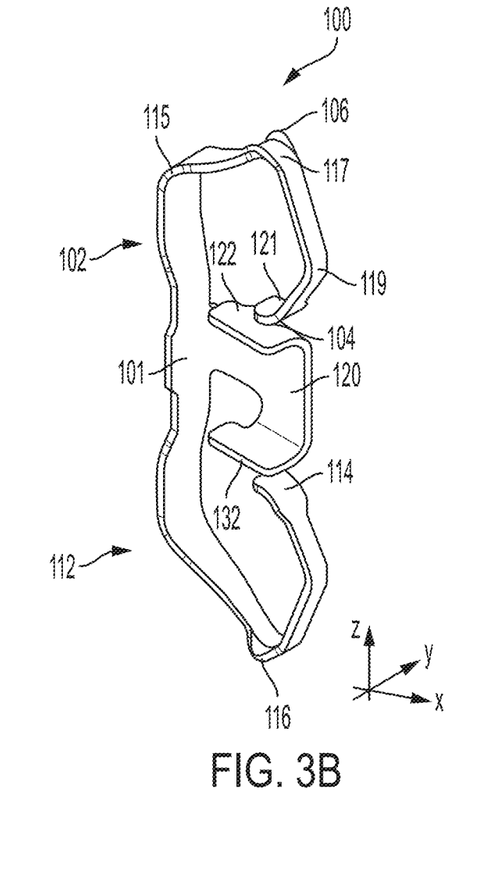
FIG. 3B is a perspective view of a contact obtained by bending the stamped portion of FIG. 3A, in an uncompressed state, in accordance with some embodiments.

FIG. 3B illustrates contact 100 upon being bent, in accordance with some embodiments. As can been appreciated by comparing FIG. 3A with FIG. 3B, the contact has been bent at multiple locations. Projection 120 has been bent by approximately 90° relative to intermediate portion 101. Intermediate portion 101 substantially lies in a yz-plane while projection 120 substantially lies in an xz-plane.

Ends 122 and 132 have been bent by approximately 90° relative to projection 120. Once bent, ends 122 and 132 form a pair of landing strips. Landing strip 122 substantially lies in a first xy-plane and landing strip 132 substantially lies in a second xy-plane parallel to the first xy-plane.

Compliant arm 102 has been bent at multiple locations: 115, 117, 119 and 121. Compliant arm 112 has been bent at multiple locations in a similar manner. When bent, the arms may be more compliant with respect to the z-axis than they are with respect to the y-axis. Each of the curved regions 115, 117, 119 and 121 defines a convex region and a concave region. The convex regions face away from arm 102 and the concave regions face the cavity formed among arm 102, projection 120 and intermediate portion 101. Wings 106 have been bent upwardly and wings 116 have been bent downwardly. Curved region 117 serves as a contact region with respect to a pad 16. As pad 16 presses further into contact 100, contact region 117 wipes against the pad, thereby improving the reliability of the mechanical connection.

Figure 3C:
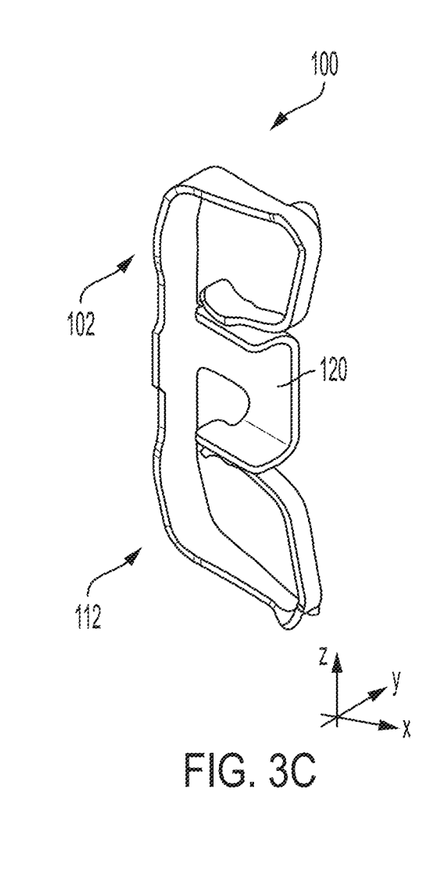
FIG. 3C is a perspective view of the contact of FIG. 3B, in a compressed state, in accordance with some embodiments.

FIG. 3B illustrates a contact 100 in the uncompressed state. In such a state, the convex portion of contact region 104 faces, but does not touch, landing strip 122 and the convex portion of contact region 114 faces, but does not touch, landing strip 132. FIG. 3C illustrates a contact 100 in a fully compressed state. Contact between contact region 104 and landing strip 122 may occur halfway through the compression range of arm 102, for example. Further compression beyond this point causes contact region 104 to wipe against landing strip 122, as shown in FIG. 3C. Similarly, contact between contact region 114 and landing strip 132 may occur halfway through the compression range of arm 112, for example. The range between the level of compression at which contact region 121 touches landing strip 122 and full compression is intended to provide tolerance with respect to height variations.

Throughout the compression cycle, contact 100 provides a non-linear force response to compression. As a connection is first made between an arm and a landing strip, the reaction force of the connection and the reaction force at the pad build quickly due to the kinematic geometry. As deflection progresses, both reaction forces soften in response to intentional kinematic changes. The distance between the physical contact tangency and virtual support of the arms increases, extending the beam length and creating a reduced spring rate. The benefit is a rapid build of force to institute a reliable electrical connection early in the mechanical bending range, and subsequently a reduced maximum reaction force near the maximum compression state. As a result, less wear occurs between mating interfaces, and less warpage occurs in the hardware supporting the interposer. This reduces packaging space and weight of assembly hardware.

Figure 3D:
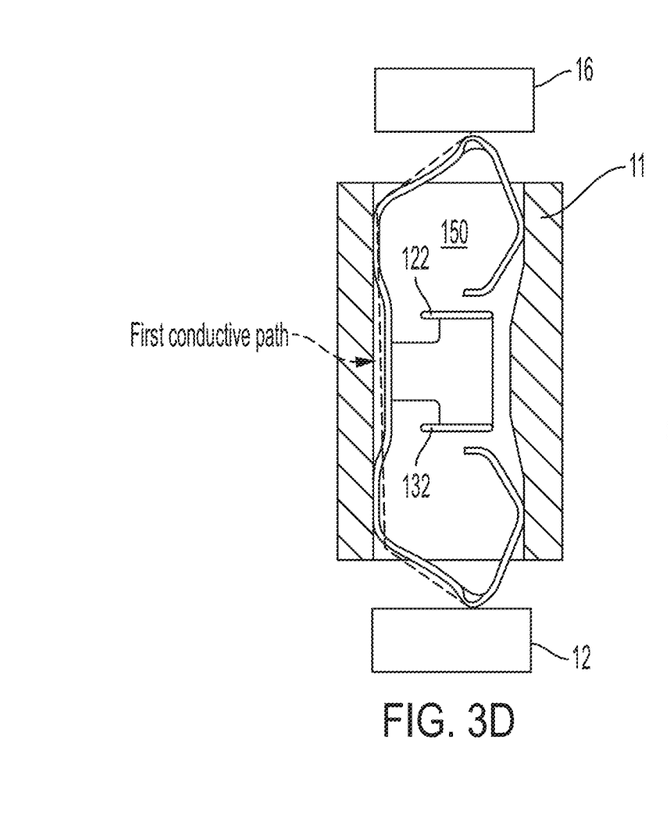
FIG. 3D is a cross sectional side view of a portion of the interposer of FIG. 2A including a contact in an uncompressed state, in accordance with some embodiments.
Figure 3E:
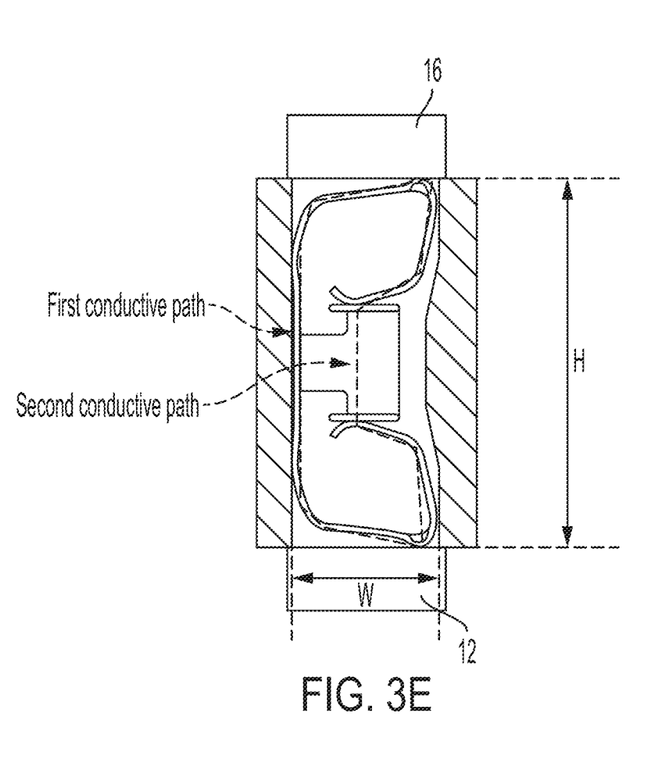
FIG. 3E is a cross sectional side view of a portion of the interposer of FIG. 2A including a contact in a compressed state, in accordance with some embodiments.

FIG. 3D is a cross sectional view of an interposer illustrating a contact 100 in an uncompressed state and FIG. 3E is a cross sectional view of the interposer illustrating a contact 100 in a fully compressed state, in accordance with some embodiments. In the depiction of FIG. 3D, pad 16 contacts the upper arm of contact 100 and pad 12 contacts the lower arm of contact, but no pressure is exerted on either ends. At this stage, a first conductive path is established from pad 16 to pad 12. This conductive path extends through intermediate portion 101. Although a portion of this conductive path may partially extend into projection 120, this conductive path exhibits more current density in the intermediate portion than it does in the projection.

In some embodiments, contact 100 is not latched or anchored to the walls of channel 150, but rather, is slidably retained in the channel. In this example, channel 150 has a constricted central portion, which prevents contact 100 from sliding out of channel 150. As a result, contact 100 is free to move inside channel 150 in the vertical direction, thus balancing the relative forces applied at either ends of the contact.

In the depiction of FIG. 3E, pads 12 and 16 are pressed against contact 100, thereby causing compression of the arms. When the arms contact projection 120, a second conductive path is established that is parallel to the first conductive path. The presence of this additional conductive path reduces the inductance and resistance of contact 100, thereby improving signal integrity.

In some embodiments, the height H of a contact (in the fully compressed state) exceeds 1.8 mm, 2 mm, 3 mm or 4 mm, for example. For example, height H may be between 1.9 mm and 2 mm, between 1.9 mm and 3 mm or between 1.9 mm and 10 mm, among other possible ranges. In one example, height H is 2.87 mm. In some embodiments, the width W of a contact is less than 1 mm (e.g., between 0.2 mm and 0.8 mm). Accordingly, this contact is tall and thin—for example, it has an aspect ratio (H/W) greater than or equal to 1.8 (e.g., between 1.8 and 5), greater than or equal to 2 (e.g., between 2 and 5) or greater than or equal to 3 (e.g., between 3 and 5). As a result, this contact allows for electronic assemblies in which the separation between two substrates exceeds 1.8 mm without necessarily reducing the contact pitch.

Figure 3F:
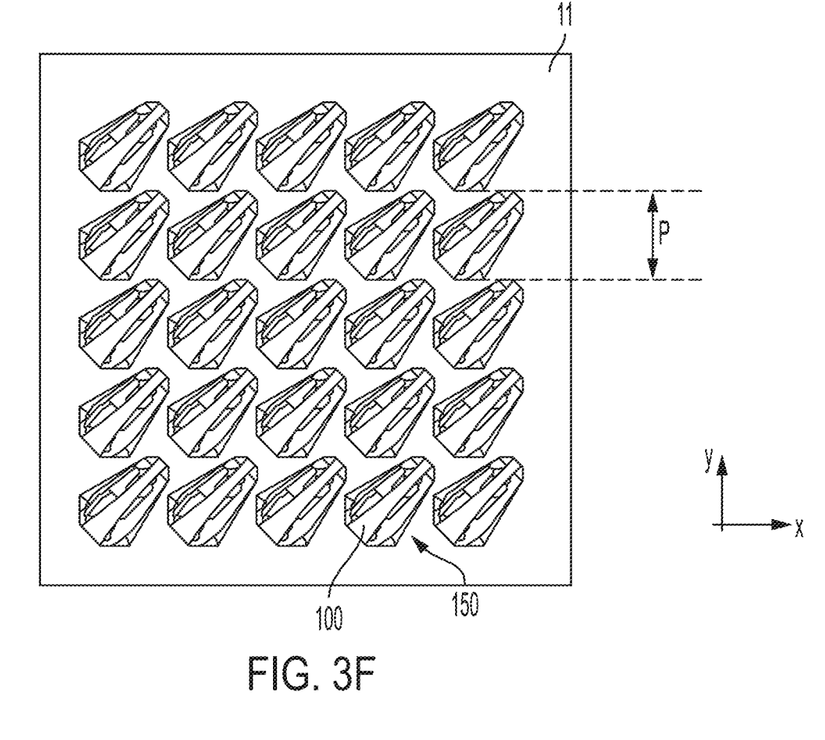
FIG. 3F is a top view of the interposer of FIG. 2A, in accordance with some embodiments.

FIG. 3F is a top view of an interposer 10, in accordance with some embodiments. This depiction illustrates an array of channels 150 each including a contact 100. The contact pitch P equals the separation between adjacent contacts along the y-axis. In some embodiments, pitch P may be 1 mm or less. The small contact pitch is enabled by the relatively small width W.

In this example, each contact 100 is shaped so that the entirety of the contact is confined within the boundaries of the respective channel 150 with respect to the xy-plane. This confined arrangement allows a reduction in the size of the substrate pads without sacrificing contact location precision. Reducing the size of a pad improves the pad's electromagnetic performance.

Figure 4A:
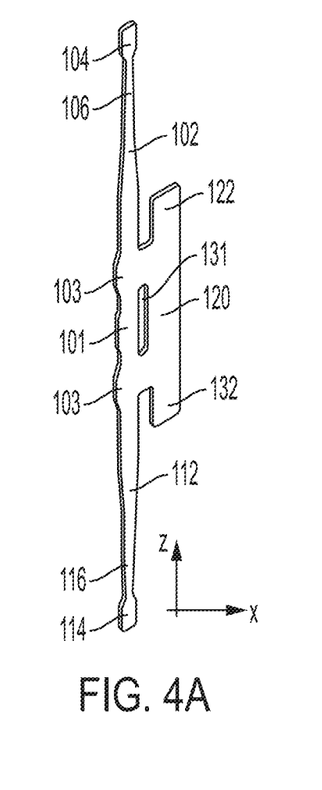
FIG. 4A is a side view of another stamped portion of a metal sheet, in accordance with some embodiments.
Figure 4B:
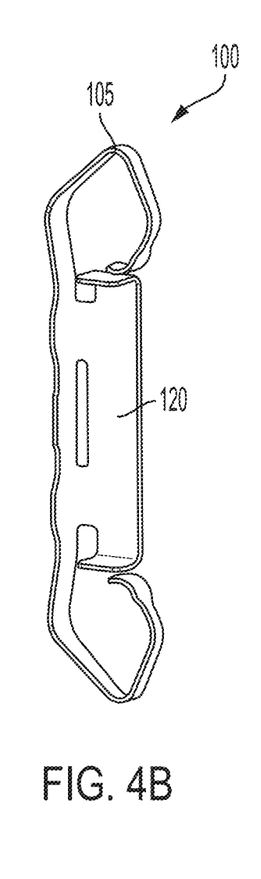
FIG. 4B is a perspective view of a contact obtained by bending the stamped portion of FIG. 4A, in an uncompressed state, in accordance with some embodiments.
Figure 4C:
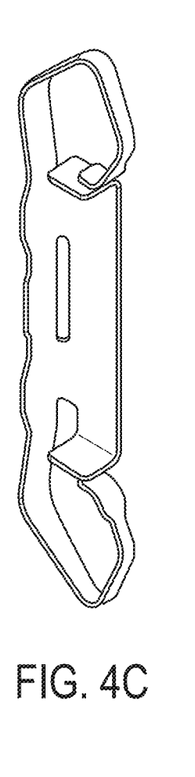
FIG. 4C is a perspective view of the contact of FIG. 4B, in a partially compressed state, in accordance with some embodiments.
Figure 4D:
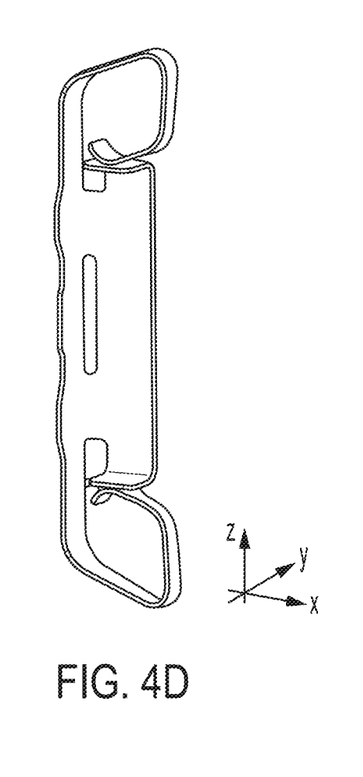
FIG. 4D is a perspective view of the contact of FIG. 4B, in a fully compressed state, in accordance with some embodiments.

FIGS. 4A-4D illustrate an alternative implementation of contact 100, in accordance with some embodiments. FIG. 4A illustrates a stamped portion of a metal sheet that may be formed into a contact. At this stage (prior to being bent), the contact has a planar shape. The contact of FIGS. 4B-4D is obtained by bending the planar element of FIG. 4A in the same manner described above in connection with FIG. 3B. FIG. 4B illustrates the contact of FIG. 4A once it has been bent. In this depiction, contact 100 is uncompressed. In FIG. 4C, contact 100 is partially compressed and the mating regions touch the respective landing strips. In FIG. 4D, the contact is fully compressed. This design operates according to the same principle of operation as described above in connection with FIGS. 3A-3F. Relative to the implementations of FIG. 3A-3F, the implementations of FIG. 4A-4D may be used for larger separations between substrates 14 and 18. For example, the height H of the contact of FIG. 4A may exceed 5 mm, 6 mm, 7 mm, 8 mm, 9 mm or 10 mm in some embodiments. In one example, height H is 7.75 mm.

The contact includes an intermediate portion 101, a projection 120 extending laterally from the intermediate portion, and a pair of arms 102 and 112 extending in opposite direction along the z-axis. Arms 102 and 112 have widths that vary along their lengths. Widened portions 104 and 114 are formed at the distal end of the arms. Ends 122 and 132 extend from projection 120 in opposite directions. In this arrangement, projection 120 is n-shaped. Two supports connect projection 120 to intermediate portion 101, with an opening 131 being formed between the supports. Opening 131 reduces the amount of material requiring bending. This reduces the forming force and reduces the variability of the material formed above and below the opening.

Connecting the projection to the intermediate portion by means of two supports increases the rigidity of the projection relative to T-shaped projections. Tabs 103 laterally extend from intermediate portion 101 opposite projection 120.

Having thus described several embodiments, it is to be appreciated various alterations, modifications, and improvements may readily occur to those skilled in the art. Such alterations, modifications, and improvements are intended to be within the spirit and scope of the invention.

For example, some contacts are described as signal contacts. Similar contacts may be used as ground contacts. In some embodiments, signal and ground contacts may be differentiated based on shape, with the ground contacts being wider than signal contacts of some or all of their length. Alternatively, they may be differentiated by position, with signal contacts being positioned in pairs between ground contacts, for example in a ground, signal, signal, ground (GSSG) pattern, where adjacent signal contacts form a differential pair. Alternatively, the contacts may be arranged in a signal, ground, signal (SGS) pattern. The ground contacts may electrically connect to a ground plane of substrate 14.

A chip socket has been described as an example of a component containing an interposer. Techniques as described herein may be used to construct an interposer used for any suitable purpose, such as to join two parallel printed circuit boards. Similarly, a printed circuit board was used as an example of a substrate with conductive structures to be connected to another device through an interposer. Techniques as described herein may be used to connect any suitable substrate to another electronic component.

Further, exemplary materials were described for portions of the interposer. Other materials may be used.

In some configurations, a semiconductor device with a Ball Grid Array or Land Grid Array may be connected to the board through the interposer. Alternatively, or additionally, the component may be the end of a flexible printed circuit. Accordingly, it should be appreciated that a component with a substrate having contact pads thereon may be pressed against the interposer to make electrical connections.

In some embodiments, a compressive force is applied to an interposer as a result of a lid being closed with some mechanism to bias the lid towards the interposer. That mechanism may include spring-like members with camming surfaces formed as part of the frame, for example. Similar spring-like members may be formed as part of a sheet-metal shell surrounding the frame and/or the interposer.

Terms signifying direction, such as "upwards" and "downwards," were used in connection with some embodiments. These terms were used to signify direction based on the orientation of components illustrated or connection to another component, such as a surface of a printed circuit board to which a termination assembly is mounted. It should be understood that electronic components may be used in any suitable orientation. Accordingly, terms of direction should be understood to be relative, rather than fixed to a coordinate system perceived as unchanging, such as the earth's surface.

Further, though advantages of the present invention are indicated, it should be appreciated that not every embodiment of the invention will include every described advantage. Some embodiments may not implement any features described as advantageous herein and in some instances. Accordingly, the foregoing description and drawings are by way of example only.

Various aspects of the present invention may be used alone, in combination, or in a variety of arrangements not specifically discussed in the embodiments described in the foregoing and is therefore not limited in its application to the details and arrangement of components set forth in the foregoing description or illustrated in the drawings. For example, aspects described in one embodiment may be combined in any manner with aspects described in other embodiments.

Also, the invention may be embodied as a method, of which an example has been provided. The acts performed as part of the method may be ordered in any suitable way. Accordingly, embodiments may be constructed in which acts are performed in an order different than illustrated, which may include performing some acts simultaneously, even though shown as sequential acts in illustrative embodiments.

Also, circuits and modules depicted and described may be reordered in any order, and signals may be provided to enable reordering accordingly.

Use of ordinal terms such as "first," "second," "third," etc., in the claims to modify a claim element does not by itself connote any priority, precedence, or order of one claim element over another or the temporal order in which acts of a method are performed, but are used merely as labels to distinguish one claim element having a certain name from another element having a same name (but for use of the ordinal term) to distinguish the claim elements.

All definitions, as defined and used herein, should be understood to control over dictionary definitions, definitions in documents incorporated by reference, and/or ordinary meanings of the defined terms.

The indefinite articles "a" and "an," as used herein in the specification and in the claims, unless clearly indicated to the contrary, should be understood to mean "at least one."

As used herein in the specification and in the claims, the phrase "at least one," in reference to a list of one or more elements, should be understood to mean at least one element selected from any one or more of the elements in the list of elements, but not necessarily including at least one of each and every element specifically listed within the list of elements and not excluding any combinations of elements in the list of elements. This definition also allows that elements may optionally be present other than the elements specifically identified within the list of elements to which the phrase "at least one" refers, whether related or unrelated to those elements specifically identified.

The phrase "and/or," as used herein in the specification and in the claims, should be understood to mean "either or both" of the elements so conjoined, i.e., elements that are conjunctively present in some cases and disjunctively present in other cases. Multiple elements listed with "and/or" should be construed in the same fashion, i.e., "one or more" of the elements so conjoined. Other elements may optionally be present other than the elements specifically identified by the "and/or" clause, whether related or unrelated to those elements specifically identified. Thus, as a non-limiting example, a reference to "A and/or B", when used in conjunction with open-ended language such as "comprising" can refer, in one embodiment, to A only (optionally including elements other than B); in another embodiment, to B only (optionally including elements other than A); in yet another embodiment, to both A and B (optionally including other elements); etc.

Also, the phraseology and terminology used herein are for the purpose of description and should not be regarded as limiting. The use of "including," "comprising," "having," "containing," or "involving," and variations thereof herein, is meant to encompass the items listed thereafter (or equivalents thereof) and/or as additional items.

What is claimed is:

1. A contact for an interposer, the contact comprising:
   an intermediate portion;
   a first compliant arm extending from the intermediate portion in a first direction, the first compliant arm comprising a first contact region; and
   a projection extending from the intermediate portion in a second direction perpendicular to the first direction, the projection comprising a first bent portion forming a first strip that is angled relative to the first direction and facing the first contact region.

2. The contact of claim 1, wherein:
   the projection further comprises a second bent portion forming a second strip parallel to the first strip; and
   the contact further comprises a second compliant arm extending from the intermediate portion in a direction opposite the first direction, the second compliant arm comprising a second contact region facing the second strip.

3. The contact of claim 1, wherein the first bent portion extends from the projection in a third direction perpendicular to both the first and second directions.

4. The contact of claim 3, wherein the first arm is more compliant in the first direction than it is in the third direction.

5. The contact of claim 3, further comprising a tab extending from the intermediate portion in the third direction, wherein the tab is parallel to the first strip.

6. The contact of claim 1, wherein the intermediate portion lies substantially in a third plane perpendicular to the second direction.

7. The contact of claim 1, wherein the first compliant arm comprises a first curved region positioned, along a length of the first compliant arm, between the intermediate portion and the first contact region, wherein the first curved region has a first convex region facing in the first direction and a first concave region facing away from the first direction.

8. The contact of claim 7, wherein the first compliant arm further comprises a pair of wings positioned adjacent to the first curved region.

9. The contact of claim 7, wherein the first contact region comprises a second curved region having a second concave region and a second convex region, wherein the second convex region faces the first strip and the second concave region faces away from the first strip.

10. The contact of claim 1, wherein the projection is made from a portion of a metal sheet, wherein, when the portion of the metal sheet is planar, the projection has a T-shape or a π-shape.

11. The contact of claim 1, wherein the contact has a height along the first direction in a fully compressed state in excess of 1.8 mm.

12. The contact of claim 11, wherein the contact has a width along the second direction in the fully compressed state in excess of 1 mm.

13. The contact of claim 1, wherein the first strip substantially lies in a plane perpendicular to the first direction.

14. An interposer comprising:
an insulative member comprising a plurality of channels extending in a first direction from a first surface of the insulative member to a second surface of the insulative member opposite the first surface; and
a plurality of contacts held in the plurality of channels, each of the plurality of contacts comprising:
an intermediate portion;
a first compliant arm extending from the intermediate portion in the first direction, the first compliant arm comprising a first contact region exposed at the first surface of the insulative member and a second contact region, wherein the first contact region is positioned, along a length of the first compliant arm, between the intermediate portion and the second contact region; and
a projection extending from the intermediate portion in a second direction perpendicular to the first direction, the projection comprising a first strip configured to touch the second contact region of the first compliant arm.

15. The interposer of claim 14, further comprising:
a second compliant arm extending from the intermediate portion in a direction opposite the first direction, the second compliant arm comprising a third contact region exposed at the second surface of the insulative member and a fourth contact region, wherein the third contact region is positioned, along a length of the second compliant arm, between the intermediate portion and the fourth contact region,
wherein the projection further comprises a second strip configured to touch the fourth contact region of the second compliant arm.

16. The interposer of claim 15, wherein the first compliant arm and the first strip are configured such that the second contact region of the first compliant arm wipes against the first strip when the first compliant arm is compressed.

17. The interposer of claim 16, wherein the second compliant arm and the second strip are configured such that the fourth contact region of the second compliant arm wipes against the second strip when the second compliant arm is compressed.

18. The interposer of claim 14, wherein:
the intermediate portion lies substantially in a first plane;
the projection lies substantially in a second plane;
the first strip lies substantially in a third plane; and
the first, second and third planes are mutually perpendicular to each other.

19. The interposer of claim 14, wherein each of the plurality of contacts further comprises a tab extending from the intermediate portion and engaging with a wall of the respective channel.

20. The interposer of claim 14, wherein the plurality of contacts are slidably retained in the respective channels in the first direction.

21. An electronic device, comprising:
a first printed circuit board (PCB) comprising a first plurality of pads;
a second PCB parallel to the first PCB, the second PCB comprising a second plurality of pads;
an electronic component mounted on the first PCB, wherein the second PCB at least partially covers the electronic component; and
an interposer disposed between the first PCB and the second PCB, the interposer having a plurality of contacts placing the first plurality of pads in electrical communication with respective pads of the second plurality of pads, wherein each contact of the plurality of contacts comprises:
an intermediate portion;
a first compliant arm in contact with a respective pad of the first plurality of pads and extending from the intermediate portion in a first direction, the first compliant arm comprising a first contact region;
a second compliant arm in contact with a respective pad of the second plurality of pads and extending from the intermediate portion in a direction opposite the first direction, the second compliant arm comprising a second contact region; and
a projection extending from the intermediate portion in a second direction perpendicular to the first direction, wherein the projection separates the first contact region from the second contact region in the first direction when the projection is in contact with the first and second contact regions.

22. The electronic device of claim 21, wherein
the projection comprises a first bent portion forming a first strip that is angled relative to the first direction and facing the first contact region.

23. The electronic device of claim 22, wherein:
the projection further comprises a second bent portion forming a second strip parallel to the first strip and facing the second contact region.

24. The electronic device of claim 22, wherein the first bent portion extends from the projection in a third direction perpendicular to both the first and second directions.

25. The electronic device of claim 21, wherein the first compliant arm comprises a first curved region positioned, along a length of the first compliant arm, between the intermediate portion and the first contact region, wherein the first curved region has a first convex region facing in the first direction and a first concave region facing away from the first direction.

26. The electronic device of claim 25, wherein the first compliant arm further comprises a pair of wings positioned adjacent to the first curved region.

27. The electronic device of claim 21, wherein the projection is made from a portion of a metal sheet, wherein, when the portion of the metal sheet is planar, the projection has a T-shape or a π-shape.

28. The electronic device of claim 21, wherein the second PCB is separated from the first PCB along the first direction by a distance between 1.9 mm and 10 mm.

* * * * *